(12) United States Patent
Seong et al.

(10) Patent No.: US 10,333,026 B2
(45) Date of Patent: Jun. 25, 2019

(54) LATERAL LIGHT EMITTING DIODE DEVICE AND METHOD FOR FABRICATING THE SAME

(71) Applicants: Tae Yeon Seong, Seoul (KR); Ki Seok Kim, Hwaseong-si (KR); Sung-joo Song, Seoul (KR)

(72) Inventors: Tae Yeon Seong, Seoul (KR); Ki Seok Kim, Hwaseong-si (KR); Sung-joo Song, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 15/629,020

(22) Filed: Jun. 21, 2017

(65) Prior Publication Data

US 2018/0006188 A1   Jan. 4, 2018

(30) Foreign Application Priority Data

Jul. 1, 2016   (KR) ........................ 10-2016-0083698

(51) Int. Cl.
*H01L 33/10* (2010.01)
*H01L 33/00* (2010.01)
(Continued)

(52) U.S. Cl.
CPC .......... *H01L 33/10* (2013.01); *H01L 33/0075* (2013.01); *H01L 33/20* (2013.01); *H01L 33/32* (2013.01); *H01L 33/38* (2013.01)

(58) Field of Classification Search
CPC ..................................................... H01L 33/10
See application file for complete search history.

(56) References Cited

U.S. PATENT DOCUMENTS 8,735,923 B2    5/2014   Jang et al.
2014/0252398 A1*  9/2014   Behringer .............. H01L 33/22
                                                       257/98

FOREIGN PATENT DOCUMENTS

JP    2005057239 A    3/2005
KR    20120034910 A    4/2012
(Continued)

OTHER PUBLICATIONS

EPO translation of KR20130027303A.*
(Continued)

*Primary Examiner* — Peniel M Gumedzoe
*Assistant Examiner* — Christopher A Johnson
(74) *Attorney, Agent, or Firm* — Andrew D. Fortney; Central California IP Group, P.C.

(57) ABSTRACT

Provided are a lateral light emitting diode device and a method for fabricating the same. The lateral light emitting diode device includes a substrate; an n-type GaN layer disposed on the substrate; an activation layer disposed on the n-type GaN layer; a p-type GaN layer disposed on the activation layer, a plurality of holes being formed in the p-type GaN layer; a current spreading layer disposed on the p-type GaN layer; a p-electrode disposed on the current spreading layer; a seed layer disposed on bottom surfaces of the plurality of holes; metal oxide structures grown on the seed layer in a crystalline state to fill the plurality of holes; and an n-electrode disposed on the n-type GaN layer exposed by removing portions of the current spreading layer, the p-type GaN layer, the activation layer, and the n-type GaN layer.

15 Claims, 12 Drawing Sheets

(51) Int. Cl.
  *H01L 33/32* (2010.01)
  *H01L 33/20* (2010.01)
  *H01L 33/38* (2010.01)

(56) References Cited

FOREIGN PATENT DOCUMENTS

| KR | 20120060992 A | * | 6/2012 |
| KR | 20130027303 A | * | 3/2013 |
| KR | 20140009793 A |   | 1/2014 |

OTHER PUBLICATIONS

EPO translation of KR20120060992A.*
Byung Yeon Choi et al.; "Light Emitting Device"; Bibliographic Data of KR20130027303 (A); Mar. 15, 2013; http://worldwide.espacenet.com.
Jun Hee Hong; "Light Emitting Device, Light Emitting Device Package and Lighting System"; Bibliographic Data of KR20120060992 (A); Jun. 12, 2012; http://worldwide.espacenet.com.

* cited by examiner

LATERAL LIGHT EMITTING DIODE DEVICE AND METHOD FOR FABRICATING THE SAME

CROSS-REFERENCE TO RELATED APPLICATIONS

This U.S. non-provisional application claims priority under 35 U.S.C. § 119 to Korea Patent Application No. 10-2016-0083698 filed on Jul. 1, 2016, the entirety of which is hereby incorporated by reference herein.

TECHNICAL FIELD

The present disclosure relates to lateral light emitting diode devices and methods for fabricating the same and, more particularly, to a lateral light emitting diode device in which holes are formed at a p-type GaN layer, a reflective wall which is a metal, a metal alloy or a dielectric material is formed on sidewalls of the holes, and metal oxide structures are grown to fill the holes.

Accordingly, since light generated at an activation layer is emitted via the metal oxide structures, a lateral light emitting diode device with improved light extraction efficiency may be implemented.

In addition, since current flow of the p-type GaN layer is improved by the metal oxide structures and the sidewalls, a lateral light emitting diode device with a large light emitting area may be improved.

BACKGROUND

A light emitting diode (LED) has various advantages such as long lifetime, low power consumption, excellent initial driving characteristics, high vibration resistance, and high tolerance for repeated power interruption, over a filament-based light emitting diode device. Therefore, a demand for the LED is continuously increasing. In particular, since III group nitride semiconductor devices are capable of emitting light in a blue short wavelength area, they have been spotlighted in the recent years.

In the case of a nitride light emitting diode, light is generated in an activation layer and is emitted to the outside through a nitride semiconductor. However, since a critical angle at the boundary between a semiconductor layer and air is small, considerable amount of light is not emitted to the outside of the nitride semiconductor layer.

Additionally, in the case of a lateral light emitting diode, current spreading is blocked due to a high resistance of a p-electrode to cause unbalance of current flow. The unbalance of current flow results in current crowding effect. Since the current crowding effect causes non-uniform light emission of an activation layer, it is difficult to increase a size and power of a device.

SUMMARY

A feature of the present disclosure is to minimize the problem that a light generated in an activation layer is not emitted to the outside.

Another feature of the present disclosure is to minimize an area in which a light emitting diode device emits a light non-uniformly.

Another feature of the present disclosure is to easily adjust an angle of beam spread of a light emitting diode device.

A lateral light emitting diode device according to an example embodiment of the present disclosure includes: a substrate; an n-type GaN layer disposed on the substrate; an activation layer disposed on the n-type GaN layer; a p-type GaN layer disposed on the activation layer, a plurality of holes being formed in the p-type GaN layer; a current spreading layer disposed on the p-type GaN layer; a p-electrode disposed on the current spreading layer; a seed layer disposed on bottom surfaces of the plurality of holes; metal oxide structures grown on the seed layer in a crystalline state to fill the plurality of holes; and an n-electrode disposed on the n-type GaN layer exposed by removing portions of the current spreading layer, the p-type GaN layer, the activation layer, and the n-type GaN layer.

In an example embodiment, the lateral light emitting diode device may further include: a reflective wall disposed on inner sidewalls of the plurality of holes.

In an example embodiment, the plurality of holes may be disposed to penetrate the current spreading layer, and the metal oxide structures may protrude on the current spreading layer.

In an example embodiment, the current spreading layer may be disposed to cover top surfaces of the metal oxide structures, and the top surfaces of the metal oxide structures may be identical to a top surface of the p-type GaN layer.

In an example embodiment, the reflective wall may be a metal or a metal alloy, and a refractive index of the metal oxide structures may be greater than a refractive index of the current spreading layer and smaller than a refractive index of the p-type GaN layer.

In an example embodiment, the reflective wall may be a dielectric material, and a reflective index of the metal oxide structures may be greater than a refractive index of the reflective wall and smaller than a refractive index of the p-type GaN layer.

In an example embodiment, the metal oxide structures may include metal oxide which is selected one of zinc oxide (ZnO), zirconium oxide ($ZrO_2$), titanium oxide ($TiO_2$), chrome oxide ($Cr_2O$), indium zinc oxide (IZO), indium zinc tin oxide (IZTO), indium oxide ($In_2O_3$), and tin oxide ($SnO_2$).

In an example embodiment, depth D and width W of the hole may satisfy a condition of D>W/4.

In an example embodiment, diameter W of the hole may satisfy a condition of $W/\lambda > 2.405$ ($\lambda$ being a wavelength of a light emitted from the activation layer).

In an example embodiment, depth of the hole may be between 200 nanometers and 1 micrometer.

In an example embodiment, depth of the hole may be between 300 nanometers and 4 micrometer.

In an example embodiment, a shape of the metal oxide structure may be a hexagonal cone, a hexagonal pillar, a hemisphere, a cone, a truncated cone or a cylinder.

In an example embodiment, the reflective wall may be electrically connected to the current spreading layer.

A method for fabricating a lateral light emitting diode device according to an example embodiment of the present disclosure includes: sequentially stacking an n-type GaN layer, an activation layer, a p-type GaN layer, and a current spreading layer on a substrate; patterning the current spreading layer and the p-type GaN layer to form a plurality of holes; removing portions of the current spreading layer, the p-type GaN layer, the activation layer, and the n-type GaN layer by using a patterning process to expose the n-type GaN layer; forming a seed layer on bottom surfaces of the plurality of the holes; growing metal oxide structures on the seed layer in a crystal state; and forming an n-electrode on the exposed n-type GaN layer and a p-electrode on the current spreading layer.

In an example embodiment, the method may further include: forming a reflective wall on inner sidewalls of the plurality of holes.

In an example embodiment, the reflective wall may be a metal or a metal alloy, and a refractive index of the metal oxide structures may be greater than a refractive index of the current spreading layer and smaller than a refractive index of the p-type GaN layer.

In an example embodiment, the refractive index may be a dielectric material, and a refractive index of the metal oxide structures may be greater than a refractive index of the reflective wall and smaller than a refractive index of the p-type GaN layer.

In an example embodiment, the metal oxide structures may include metal oxide which is selected one of zinc oxide (ZnO), zirconium oxide ($ZrO_2$), titanium oxide ($TiO_2$), chrome oxide ($Cr_2O$), indium zinc oxide (IZO), indium zinc tin oxide (IZTO), indium oxide ($In_2O_3$), and tin oxide ($SnO_2$).

In an example embodiment, the metal oxide structures may be grown by means of hydrothermal deposition.

A method for fabricating a lateral light emitting diode device according to another example embodiment of the present disclosure include: sequentially stacking an n-type GaN layer, an activation layer, and a p-type GaN layer on a substrate; patterning the p-type GaN layer to form a plurality of holes; forming a seed layer on bottom surfaces of the plurality of holes; growing metal oxide structures on the seed layer in a crystal state; forming a current spreading layer on the substrate where the metal oxide structures are formed; removing portions of the current spreading layer, the p-type GaN layer, the activation layer, and the n-type GaN layer to locally expose the n-type GaN layer; and forming an n-electrode on the exposed n-type GaN layer and a p-electrode on the p-type GaN layer.

In an example embodiment, the method may further include: forming a reflective wall on inner sidewalls of the plurality of holes.

BRIEF DESCRIPTION OF THE DRAWINGS

The present disclosure will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

Figure 1A:
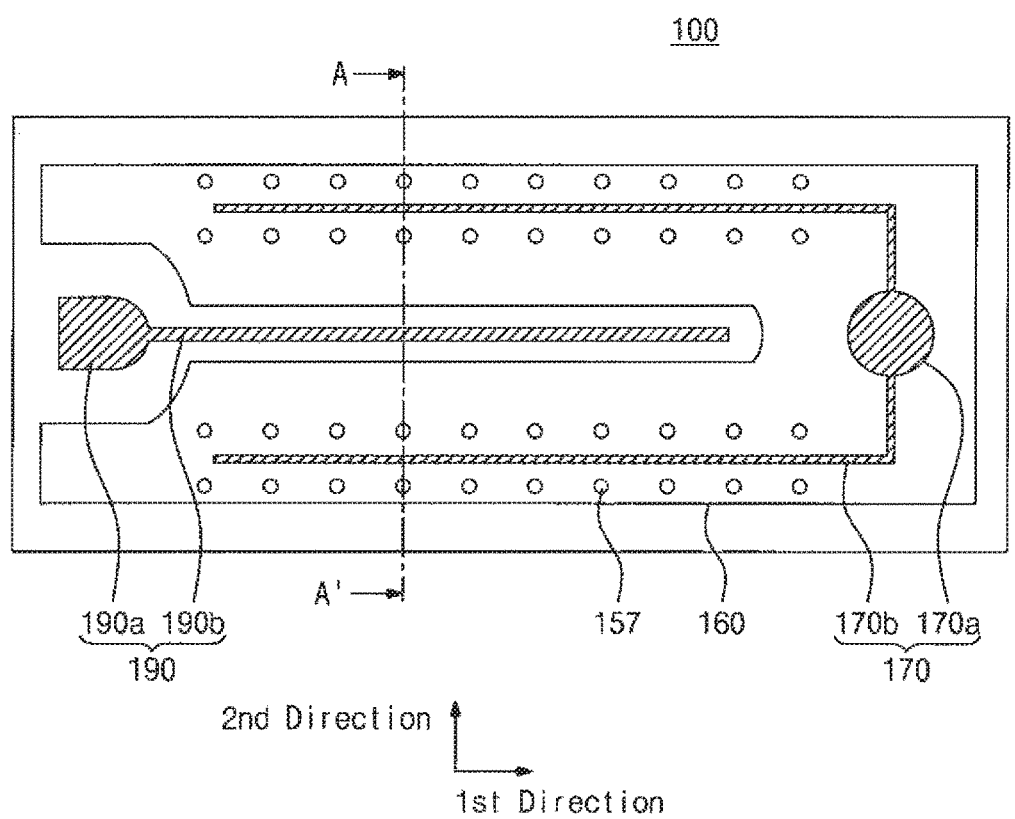
FIG. 1A is a top plan view of a lateral light emitting diode device according to an example embodiment of the present disclosure.

A light traveling from a dense medium to a sparse medium is totally reflected at the boundary of the two media, which is called total reflection. The total reflection also occurs in a light emitting diode using a III group nitride-based material. A conventional III group nitride-based material used in an n-type semiconductor layer, a p-type semiconductor layer, an activation layer, etc. is gallium nitride (GaN), and a refractive index of the GaN is about 2.4. Since there is no substantial difference in refractive index between two media when a light generated in an activation layer travels to an n-type semiconductor layer or a p-type semiconductor layer, the light may easily travel. However, since there is a significantly large difference in refractive index between the GaN and air, a critical angle at the boundary of the n-type or p-type semiconductor layer and air is small. Thus, considerable amount of the light is not emitted to the outside. According to an example embodiment of the present disclosure, since a light generated in an activation layer may travel to the outside via metal oxide structures, light extraction efficiency may be improved.

In a conventional lateral light emitting diode device, current crowding occurs around a p-electrode. Therefore, a light emitting distribution of the lateral light emitting diode device is concentrated around the p-electrode. According to an example embodiment of the present disclosure, a reflective wall may be a metal or a metal alloy with high electrical conductivity. The reflective wall may be disposed on inner sidewalls of a plurality of holes of a p-type GaN layer and may come in contact with a current spreading layer disposed on the p-type GaN layer to be electrically connected to the current spreading layer. Thus, the reflective wall may change a distribution of an electric field and holes flowing in from the p-type electrode may uniformly migrate to the p-type GaN. As a result, the reflective wall may relieve the current crowing around the p-electrode to minimize a non-light-emitting area in the device.

As a conventional method for increasing an angle of beam spread of a lateral light emitting diode device, particles are inserted into an encapsulation material to scatter a light or change shapes of a lens and a package. According to an example embodiment of the present disclosure, an angle of beam spread of a light of a lateral light emitting diode device may be differently adjusted depending on the shape of ends of metal oxide structures.

The advantages and features of the present disclosure and methods of achieving them will be apparent from the following exemplary embodiments that will be described in more detail with reference to the accompanying drawings. It should be noted, however, that the present disclosure is not limited to the following exemplary embodiments, and may be implemented in various forms. Accordingly, the exemplary embodiments are provided only to disclose examples of the present disclosure and to let those skilled in the art understand the nature of the present disclosure.

In the specification, it will also be understood that when an element or lines are referred to as being "on" a target element block, it can be directly on the target element block, or intervening another element may also be present. In the drawings, thicknesses of elements are exaggerated for clarity of illustration.

The terms used in the specification are for the purpose of describing particular embodiments only and are not intended to be limiting of the invention. As used in the specification, the singular forms "a", "an" and "the" are intended to include the plural forms as well, unless the context clearly indicates otherwise. It will be further understood that the terms "comprises" and/or "comprising", when used in the specification, specify the presence of stated features, integers, steps, operations, elements, and/or components, but do not preclude the presence or addition of one or more other features, integers, steps, operations, elements, components, and/or groups thereof.

Each embodiment described and exemplified herein may include a complementary embodiment thereof.

Example embodiments will now be described more fully with reference to the accompanying drawings, in which some example embodiments are shown. Example embodiments may, however, be embodied in many different forms and should not be construed as being limited to the embodiments set forth herein; rather, these example embodiments are provided so that this disclosure will be thorough and complete, and will fully convey the scope of example embodiments of the present disclosure to those of ordinary skill in the art. In the drawings, the thicknesses of layers and regions are exaggerated for clarity. Like reference characters and/or numerals in the drawings denote like elements, and thus their description may be omitted.

FIG. 1A is a top plan view of a lateral light emitting diode device according to an example embodiment of the present disclosure.

Figure 1B:
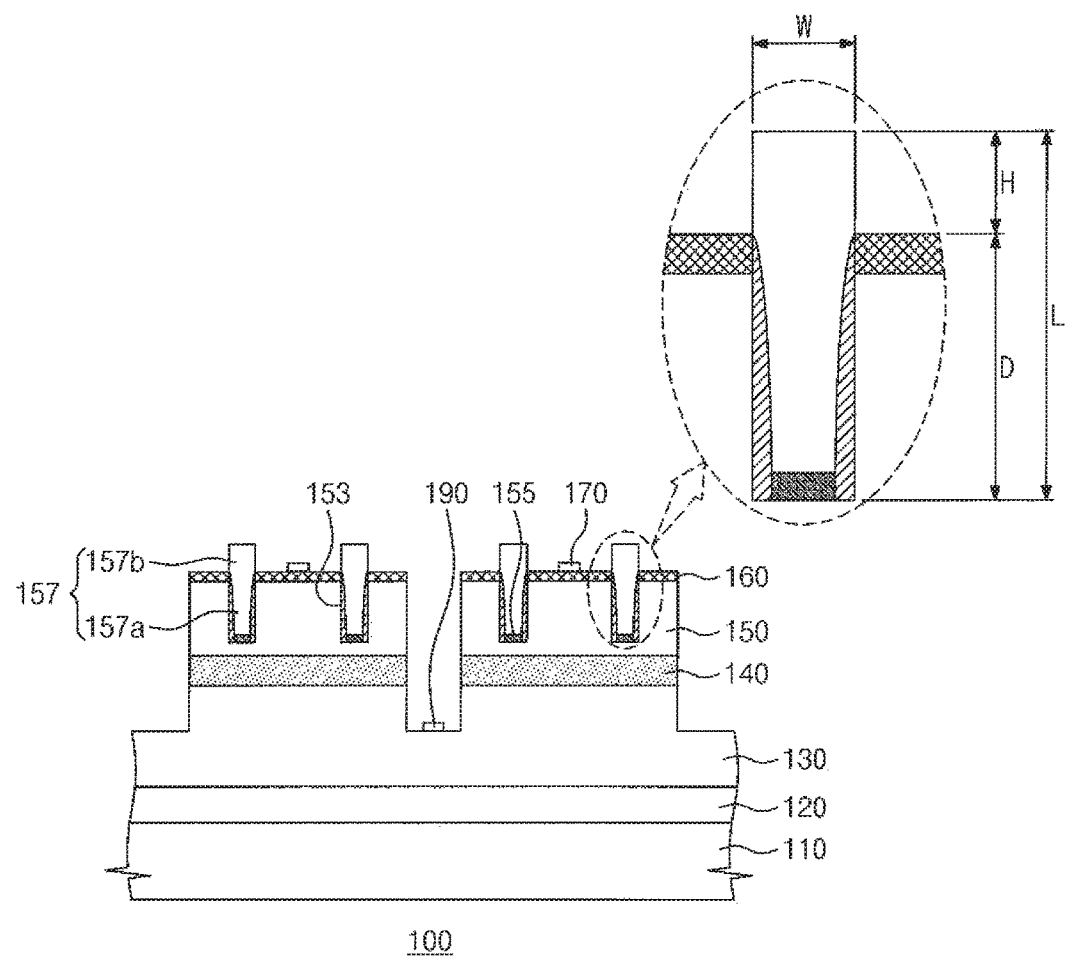
FIG. 1B is a cross-sectional view taken along the line A-A' in FIG. 1B.

FIG. 1B is a cross-sectional view taken along the line A-A' in FIG. 1B.

Figure 1C:
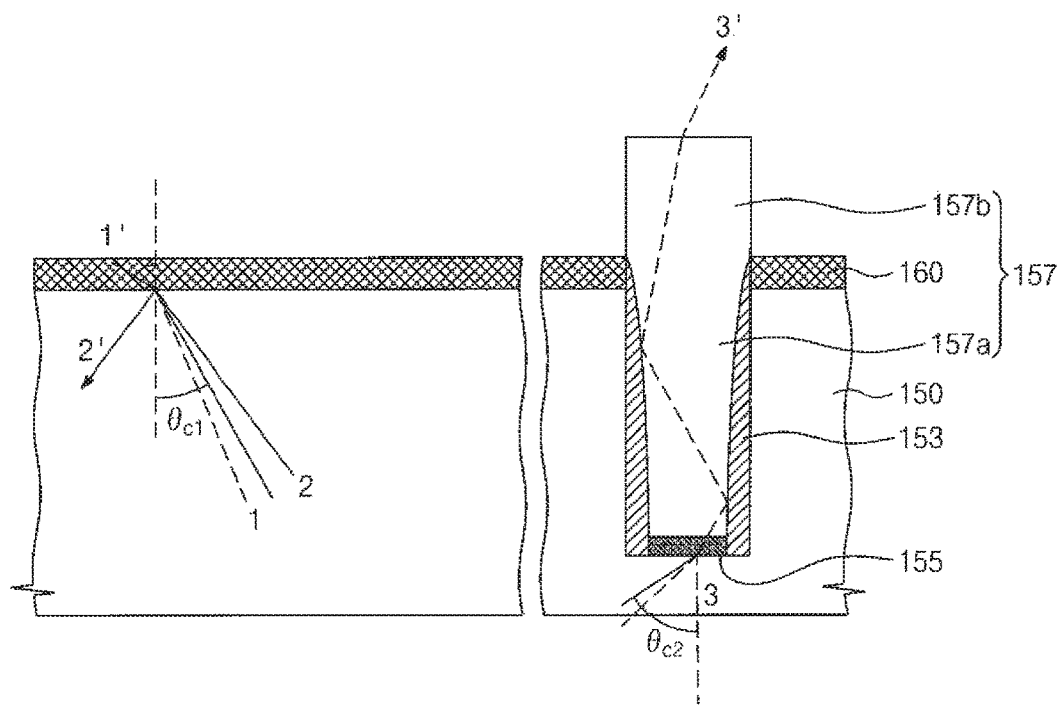
FIG. 1C illustrates a light traveling path formed by a metal oxide structure and a reflective wall in FIG. 1B.

FIG. 1C illustrates a light traveling path formed by a metal oxide structure and a reflective wall in FIG. 1B.

A lateral light emitting diode device 100 according to an example embodiment of the present disclosure includes a substrate 110; an n-type GaN layer 130 disposed on the substrate 110; an activation layer 140 disposed on the n-type GaN layer 130; a p-type GaN layer 150 disposed on the activation layer 140, a plurality of holes 151 being formed in the p-type GaN layer 150; a current spreading layer 160 disposed on the p-type GaN layer 150; a p-electrode 170 disposed on the current spreading layer 160; a seed layer 155 disposed on bottom surfaces of the plurality of holes 151; metal oxide structures 157 grown on the seed layer 155 in a crystalline state to fill the plurality of holes 151; and an n-electrode 190 disposed on the n-type GaN layer 130 exposed by removing portions of the current spreading layer 160, the p-type GaN layer 150, the activation layer 140, and the n-type GaN layer 130.

The substrate 110 is provided to epitaxially grow compound semiconductors such as the n-type GaN layer 130, the activation layer 140, and the p-type GaN layer 150. The substrate 110 may have similar crystal structure and orientation to the compound semiconductor layers. The substrate 110 may change into a transparent substrate such as sapphire, silicon carbide (SiC), aluminum nitride (AlN), or silicon.

A buffer layer 120 may be disposed on the substrate 110. The buffer layer 120 may be undoped gallium nitride (GaN). The buffer layer 120 reduces a difference in grating constant between the substrate 110 and the n-type GaN layer 130. The buffer layer 120 serves to relieve stress between the substrate 110 and the n-type GaN layer 130.

The n-type GaN layer 130 is deposited on the buffer layer 120. An n-type impurity may be silicon (Si).

The activation layer 140 is deposited on the n-type GaN layer 130. In the activation layer 140, electrons injected in the n-type GaN layer 120 and holes injected in the p-type GaN layer 150 are combined with each other. The activation layer 140 emits a light of a wavelength corresponding to a band gap difference depending on a material constituting the activation layer 140. The activation layer 140 may be a double heterostructure, a single quantum well or multiple quantum wells. In the case that the lateral light emitting diode device 100 is a blue or green LED, the multiple quantum wells may be an InGaN/GaN structure. In the case of ultraviolet, the multiple quantum wells may be AlGaN/InGaN structure.

An electron blocking layer (EBL, not shown) may be additionally disposed on the activation layer 140. The electron blocking layer blocks electrons that are injected from the n-type GaN layer 130 and pass the activation layer 140. The electron blocking layer provides holes injected in the p-type GaN layer 150 to the activation layer 140 after allowing the holes to pass therethrough. The electron blocking layer may improve recombination of the electrons and the holes. The electron blocking layer is AlGaN doped with p-type impurity.

The p-type GaN layer 150 may be disposed on the activation layer 140 or the electron blocking layer (not shown). A p-type impurity may be magnesium (Mg).

The plurality of holes 151 are formed in the p-type GaN layer 150. Bottom surfaces of the holes may not be in contact with the activation layer 140. The holes may penetrate the current spreading layer 160. The holes 151 may be formed by a reactive ion etching (RIE) process. Depth D and diameter W of the holes 151 may be determined by an etching process. The depth D and the diameter W of the holes 151 may satisfy the Equations (1) and (2) below.

$$D > W/4 \qquad \text{Equation (1)}$$

$$W/\lambda > 2.405 \qquad \text{Equation (2)}$$

($\lambda$ being a wavelength of a light emitted from the activation layer 140)

The Equation (1) is a conditional expression in which the metal oxide structures 157 is stably grown in a direction perpendicular to the p-type GaN layer 150. The Equation (2) is a conditional expression to stably guide the metal oxide structure 157. Depth D and diameter W of the holes which satisfy the Equations (1) and (2) are between 200 nanometers and 1 micrometer and between 300 nanometers and 4 micrometers, respectively.

The plurality of holes 151 are formed considering a current density, a spatial distribution or a light emitting intensity spatial distribution of the lateral light emitting diode device 100. The holes 151 may be disposed with a constant distance from a finger of the p-electrode 170. The holes 151 may be periodically arranged with a sufficient density for light extraction. The holes 151 may have a shape of a cylinder or a truncated cone.

A reflective wall 153 is disposed on inner sidewalls of the holes 151. The reflective wall 153 may be in contact with the current spreading layer 160. The reflective layer 153 may be a metal or a metal alloy having a high electric conductivity. A material of the reflective wall 152 may include at least one metal selected from the group consisting of aluminum (Al), copper (Cu), silver (Ag), and titanium (Ti). The reflective wall 153 may provide an ohmic junction with the p-type GaN layer 150. Accordingly, the reflective wall 153 may change a shape of an electric field to provide spatially uniform current and may increase current density at lower portions of the holes 151. Moreover, the reflective wall 153 and the metal oxide structures 157 may provide current spreading effect. A light generated at the lower portions of the holes 151 may be metallically reflected on an inner sidewall or an outer side of the reflective wall 153 to be extracted to the outside. Thus, light extraction efficiency is improved.

According to a modified embodiment of the present disclosure, the reflective wall 153 may be a dielectric material and a refractive index of the reflective wall 153 may be smaller than that of the metal oxide structures 157. Thus, light impinging on the metal oxide structures 157 may be made to travel by total reflection.

The seed layer 155 is disposed on bottom surfaces of the holes 151. The seed layer 155 may be deposited by a sputtering process. The seed layer 155 may operate as a seed of crystal growth of the metal oxide structures 157. A thickness of the seed layer 155 may be between 30 and 200 nanometers. The seed layer 155 may be the same or similar material as the metal oxide structures 157 and may be a transparent material through which a light can pass.

The metal oxide structures 157 may be grown in a crystal state to fill the holes 151 based on the seed layer 155. A material of the metal oxide structures 157 may be one of zinc oxide (ZnO), zirconium oxide ($ZrO_2$), titanium oxide ($TiO_2$), chrome oxide ($Cr_2O$), indium zinc oxide (IZO), indium zinc tin oxide (IZTO), indium oxide ($In_2O_3$), and tin oxide ($SnO_2$). The material of the metal oxide structures 157 may satisfy the condition of $N_I<N_{NR}<N_P$ ($N_I$ being a refractive index of the current spreading layer 160 and $N_p$ being a refractive index pf the p-type GaN layer 150).

The metal oxide structures may include a filling portion 157a and a protruding portion 157b. The metal oxide structures 157 may have a total length L and a height H of the protruding portion 157b. The filling portion 157a is a portion filling holes formed in the p-type GaN layer 150 and the current spreading layer 160. A side surface of the filling portion 157a is in contact with the reflective wall 153, and a bottom surface of the filling portion 157a is in contact with the seed layer 155. The protruding portion 157b is the other portion of the metal oxide structures 157, except for the filling portion 157a. A height H of the protruding portion 157b is a distance protruding to the current spreading layer 160 on the basis of a cross section.

A side surface and a top surface of the protruding portion 157b are exposed to air, and a bottom surface of the protruding portion 157b is in contact with the top surface of the filling portion 157a. A shape of the protruding portion 157b may be one of a hexagonal cone, a hexagonal pillar, a hemisphere, a cone, a truncated cone, or a cylinder. The shape of the protruding portion 157b may adjust an angle of beam spread.

The current spreading layer 160 is disposed on the p-type GaN layer 150. The current spreading layer 160 may be transparent conductive metal oxide. The current spreading layer 150 may uniformly provide current to the p-type GaN layer 150 to provide light emission in the entire area of the activation layer 140. The current spreading layer 160 may be indium tin oxide (ITO) or tin oxide ($SnO_2$). The current spreading layer 160 may have a transparent characteristic, a sufficiently low sheet resistance characteristic, and a characteristic to form an ohmic contact with the p-type GaN layer 150. In general, the current spreading layer 160 may be formed to be sufficient thin to the level of several tens of nanometers to have a sufficient transmittance. However, when the current spreading layer 160 does not have a sufficient thickness, the current spreading layer 160 may not effectively spread current. When the thickness of the current spreading layer 160 increases, current spreading characteristics may be improved. However, when the current spreading layer 160 is thick, the large amount of light generated at the activation layer 140 may be absorbed to the current spreading layer 160. Thus, an optical transmittance of the current spreading layer 160 may be reduced.

The above-mentioned disadvantage may be overcome by the reflective wall 153 and the metal oxide structures 157. The metal oxide structures 157 are disposed at the holes 151 formed in the p-type GaN layer 150, and the protruding portion 157b is exposed to the outside. A light emitted from the activation layer 140 may travel directly to the outside via the metal oxide structures 157. As a result, the current spreading layer 160 may have a greater thickness in a conventional lateral light emitting diode device in consideration of current spreading effect. Current crowding at the p-type GaN layer 150 may be minimized by the reflective layer 153 that is in contact with the current spreading flayer 160. Thus, a light emitting area of the lateral light emitting diode device 100 may be maximized.

When the refractive index $N_P$ of the p-type GaN layer 150 is about 2.4 and the material of the metal oxide structures 157 is zinc oxide (ZnO), a refractive index $N_{NR}$ of the metal oxide structure 157 is about 2.2. When the refractive index $N_P$ of the p-type GaN layer 150 is about 2.4 and the material of the current spreading layer 160 is indium tin oxide (ITO), a refractive index of the current spreading layer 160 is about 1.9. A critical angle $\theta_{c1}$ at the boundary of the p-type GaN layer 150 and the current spreading layer 160 is about 59 degrees. When the light generated from the activation layer 140 impinges on the boundary of the p-type GaN layer 150 and the current spreading layer 160, a light impinging at an angle less than the critical angle $\theta_{c1}$ is refracted to the current spreading layer 160 (1-1' course) and a light impinging at an angle greater than the critical angle $\theta_{c1}$ is totally reflected to the p-type GaN layer 150 (2-2' course).

A critical angle critical angle $\theta_{c2}$ at the boundary of the p-type GaN layer 150 and the filling portion 157a is about 66 degrees. When the light generated from the activation layer 140 impinges on the boundary of the p-type GaN layer 150 and the filling portion 157a, the light impinging at the angle less than the critical angle critical angle $\theta_{c2}$ is refracted to the filling portion 157a. The refracted light is reflected by the reflective wall 153 to travel to the outside through the protruding portion 157b (3-3' course). That is, the critical angle $\theta_{c2}$ at the boundary of the p-type GaN layer 150 and the filling portion 157a is greater than the critical angle $\theta_{c1}$ at the boundary of the p-type GaN layer 150 and the current spreading layer 160. Accordingly, a range of an incident angle at which the light generated from the activation layer 140 can travel to the p-type GaN layer 150 is wider than a range of an incident angle at which the light generated from the activation layer 140 can travel to the metal oxide structure 157. As a result, the light generated from the activation layer 140 may be emitted to the outside by a difference between the critical angles.

A height H of the protruding portion 157b may be quarter wavelength. Thus, the protruding portion 157b may operate as an optical waveguide.

The lateral light emitting diode device 100 has a mesa structure in which portions of the current spreading layer 160, the p-type GaN layer 150, the activation layer 140, and the n-type GaN layer 130 are removed. The mesa structure may include an edge area in which circumferences of the current spreading layer 160, the p-type GaN layer 150, and the activation layer 140 are removed and an n-electrode pad area in which an n-electrode pad is to be disposed.

The p-electrode 170 may be disposed on the current spreading layer 160. Conventionally, when the p-electrode 170 is disposed on the current spreading layer 160, the p-electrode 170 may be formed of a metal and may operate as an electrode pad for wire connection while operating as an electrode. The p-electrode 170 may include a p-electrode pad 170a electrically connected to the outside by a wire and a p-electrode finger 170b branching from the p-electrode pad 170a. After branching into two parts at the p-electrode pad 170a and extending in a second direction, the p-electrode finger 170b may extend in a first direction. On a disposition plane of an LED device, the first direction means a horizontal direction in which an n-electrode pad and a p-electrode pad are connected to each other and the second direction means a direction perpendicular to the first direction. The p-electrode 170 may be Ti or Cr-based multilayer structure such as Ni/Au, Ti/Al, Ti/Al/Ni/Au, Cr/Al or Cr/Al/Ni/Au.

The n-electrode 190 may be disposed on an area of the n-type GaN layer 130 exposed by the mesa structure. The n-electrode 190 may include an n-electrode pad 190a and an n-electrode finger 190b. The n-electrode pad 190a may be disposed opposite to the p-electrode pad 170a. The n-electrode pad 190a may be disposed on the n-electrode pad area. The n-electrode finger 190b may extend from the n-electrode pad 190a in the first direction. The n-electrode finger 190b may be disposed in the edge area. The n-electrode 190 may be a Cr/Au structure, a Cr/Al/Pt/Au structure, a Ti/Au structure, a Ti/Al structure or a Ti/Al/Ni/Au structure.

According to a modified embodiment of the present disclosure, the reflective wall 153 may be removed.

FIGS. 2A to 2I illustrate a method for fabricating a lateral light emitting diode device according to another example embodiment of the present disclosure.

A method for fabricating a lateral light emitting diode device 100 according to an example embodiment of the present disclosure includes: sequentially stacking an n-type GaN layer, an activation layer, a p-type GaN layer, and a current spreading layer on a substrate; patterning the current spreading layer and the p-type GaN layer to form a plurality of holes; removing portions of the current spreading layer, the p-type GaN layer, the activation layer, and the n-type GaN layer by using a patterning process to expose the n-type GaN layer; forming a seed layer on bottom surfaces of the plurality of the holes; growing metal oxide structures on the seed layer in a crystal state; and forming an n-electrode on the exposed n-type GaN layer and a p-electrode on the current spreading layer.

Figure 2A:
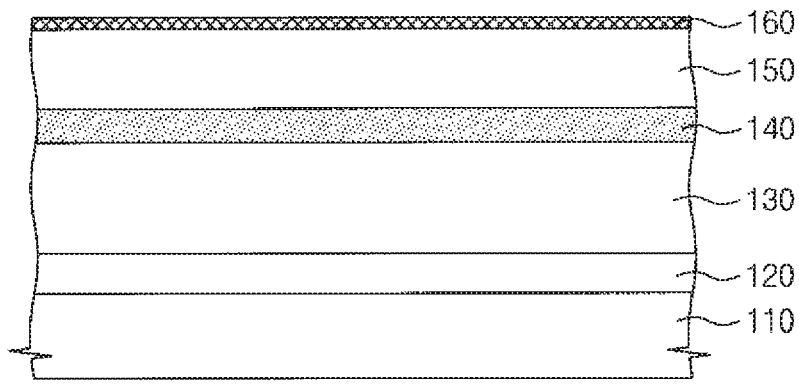
FIGS. 2A to 2I illustrate a method for fabricating a lateral light emitting diode device according to another example embodiment of the present disclosure.

Referring to FIG. 2A, an n-type GaN layer 130, an activation layer 140, and a p-type GaN layer 150 are sequentially grown on a substrate 110. Before the n-type GaN layer 150 is grown on the substrate 110, the buffer layer 170 may be grown on the substrate 110. A buffer layer 120 reduces a grating constant of the substrate 110 and the n-type GaN layer 130. The buffer layer 120 serves to relieve stress between the substrate 110 and the n-type GaN layer 130. The buffer layer 120, the n-type GaN layer 130, the activation layer 140, and the p-type GaN layer 150 may be grown by a deposition process such as metal-organic chemical vapor deposition (MOCVD), molecular beam epitaxy (MBE) or hydride vapor phase epitaxy (HVPE).

After the p-type GaN layer 150 is deposited, a current spreading layer 160 is deposited on the p-type GaN layer 150. The current spreading layer 160 is deposited on the p-type GaN layer 150 by a sputtering process.

Figure 2B:
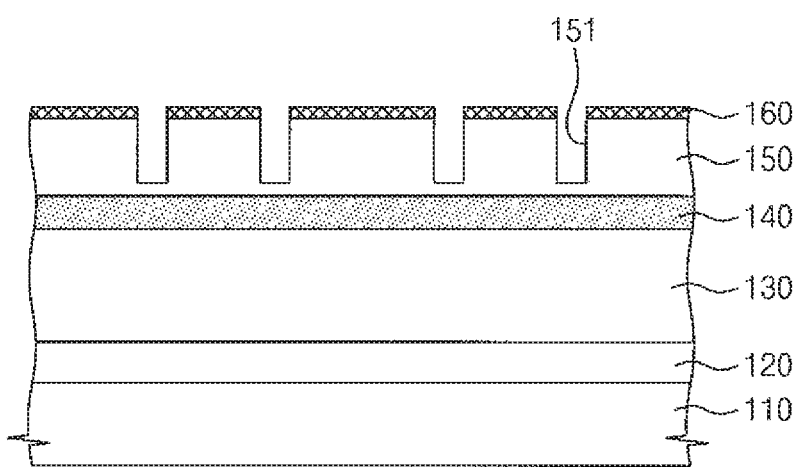

Referring to FIG. 2B, a photoresist (PR) pattern is formed on the current spreading layer 160. The p-type GaN layer 150 and the current spreading layer 160 are patterned using the photoresist pattern as an etching mask. As a result, a plurality of holes 151 are formed in the p-type GaN layer 150 and the current spreading layer 160. The photoresist pattern is removed.

Figure 2C:
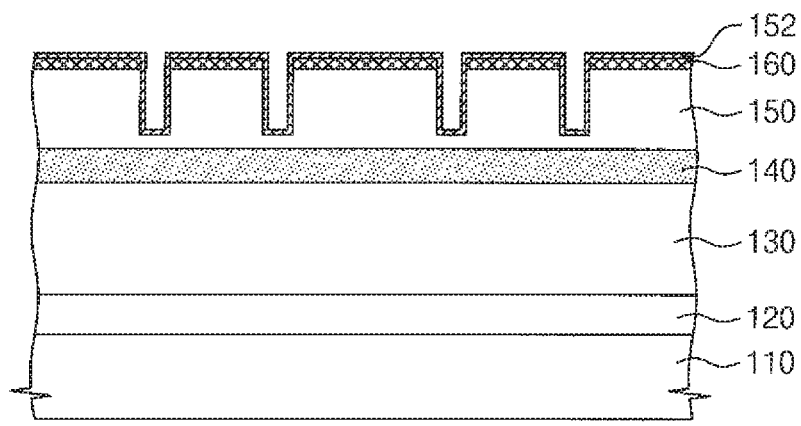

Referring to FIG. 2C, a preliminary reflective layer 152 that is a metal or a metal alloy is deposited on the substrate 110 by a chemical vapor deposition (CVD) process.

According to a modified embodiment of the present disclosure, the preliminary reflective layer 152 may be replaced with a dielectric material. A refractive index of the preliminary reflective layer 152 may be smaller than that of a metal oxide structure. The preliminary reflective layer 152 may be a silicon oxide layer.

Figure 2D:
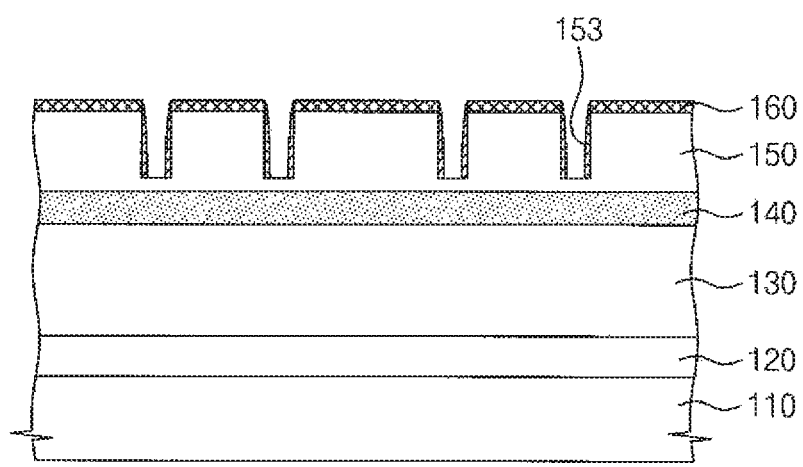

Referring to FIG. 2D, the preliminary reflective layer 152 is anisotropically etched to remove the other portions except for the preliminary reflective layer 152 disposed on sidewalls of the holes 151. The unremoved preliminary reflective layer 152 provides a reflective wall 153.

Figure 2E:
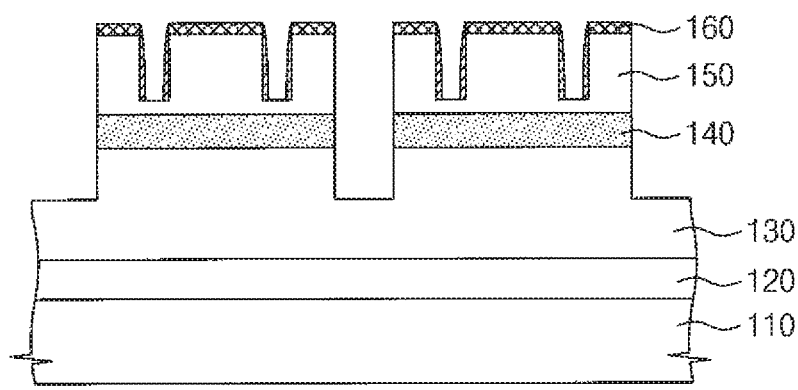

Referring to FIG. 2E, portions of the current spreading layer 160, the p-type GaN layer 150, the activation layer 140, and the n-type GaN layer 130 are locally removed. As a result, the lateral light emitting diode device 100 may have a mesa structure.

Figure 2F:
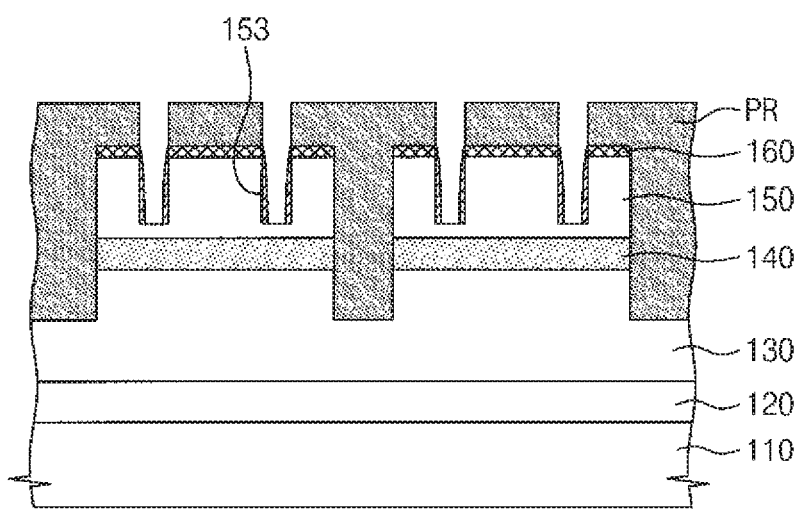

Referring to FIG. 2F, a photoresist (PR) pattern where openings corresponding to positions of the holes 151 are formed is formed on the current spreading layer 160.

Figure 2G:
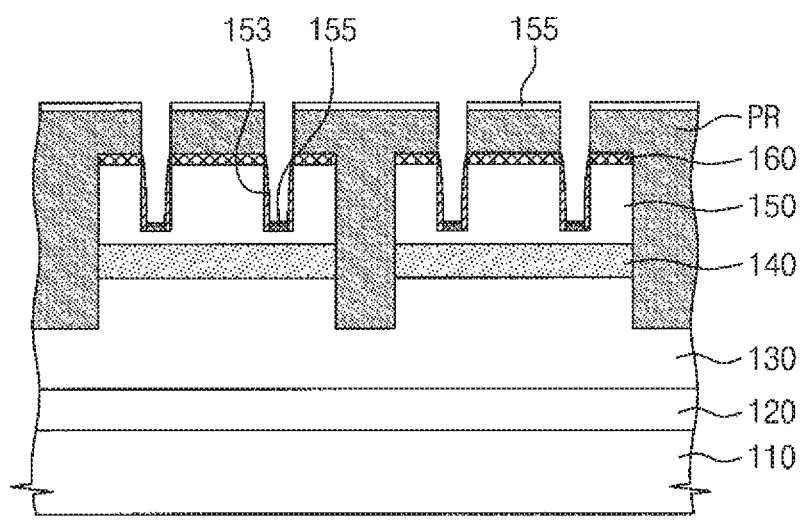

Referring to FIG. 2G, a seed layer 155 is deposited on the substrate 110. Thus, the seed layer 155 is formed on bottom surfaces of the holes 151.

Figure 2H:
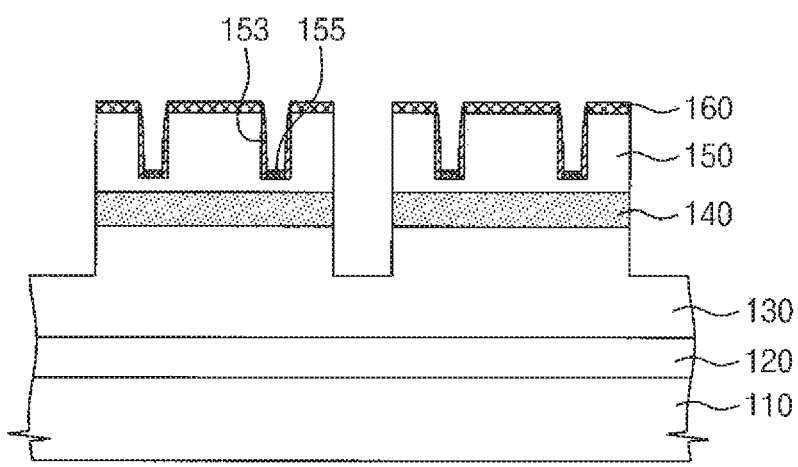

Referring to FIG. 2H, the photoresist pattern is removed.

Figure 2I:
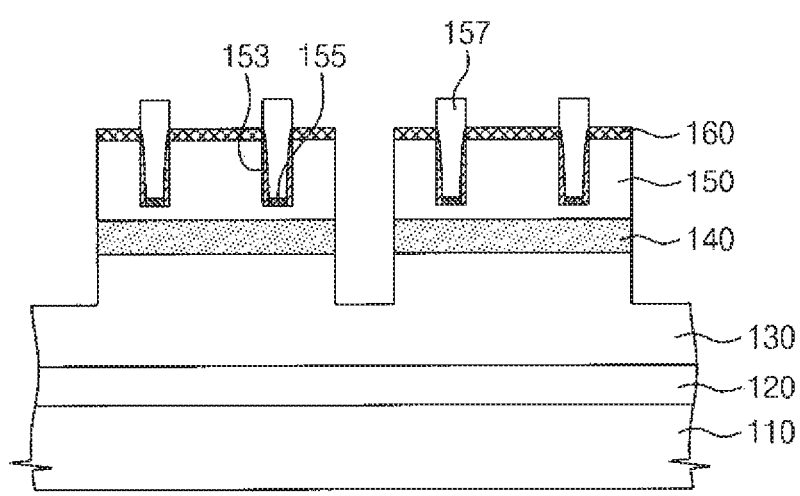

Referring to FIG. 2I, metal oxide structures 157 are grown on the seed layer 155 in a crystal state. The metal oxide structures 157 may be grown similarly to a crystalline structure of the seed layer 155.

The metal oxide structures 157 are grown by a process such as metal organic chemical vapor deposition (MOCVD), hydrothermal deposition or electrochemical deposition. A procedure of growing the metal oxide structures 157 by the hydrothermal deposition will now be described in brief with reference to chemical reaction formulae below.

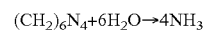

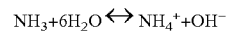

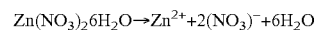

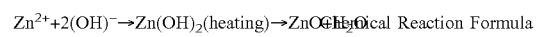

(1) There is prepared an aqueous water in which deionized water, zinc nitrate hexahydrate ($Zn(NO_3)_2 6H_2O$), and hexamethylenetramine (HMT, $(CH_2)_6N_4$) are agitated at a predetermined molar ratio.

A molar ratio of the zinc nitrate hexahydrate and the hexamethylenetramine may be between 2:1 and 1:2. The hexamethylenetramine may play a role in a catalyst to help fast growth of the metal oxide structures 157 and may continue to supply $OH^-$ ions or the like. Besides the hexamethylenetramine, urea or ammonia may be used. In the aqueous water, a molarity of the zinc nitrate hexahydrate and the hexamethylenetramine may be between 0.0001M and 1M. When the molarity is less than 0.0001M, it is difficult to adjust the content of the zinc nitrate hexahydrate and the hexamethylenetramine and the metal oxide structures 157 are not formed well. When the molarity is greater than 1M, it is difficult to adjust shape and size of the metal oxide structures 157.

(2) After the seed layer 155 is dipped into the aqueous water, the seed layer 155 is heated for 3 to 12 hours such that a temperature is maintained within the range of 80 to 100 degrees centigrade to grow zinc oxide (ZnO). If aqueous water containing $Zn^{2+}$ and $O^-$ ions is provided to the holes in which the seed layer 155 is deposited, the $Zn^{2+}$ and $O^-$ ions are adsorbed to the seed layer 155 to perform nucleation and growth.

During a hydrothermal deposition process, shape, diameter, and length of the metal oxide structures may be controlled by changing conditions such as temperature, time, the amount of the aqueous water, molar ratio, and pH. Thus, the metal oxide structures 157 having various diameters, shapes, and heights may be formed according to purposes.

Returning to FIG. 1B, after the metal oxide structures 157 are grown, an n-electrode 190 is formed on an area in which the n-type GaN layer 130 is exposed, by a lift-off process. A p-electrode 170 is formed on the current spreading layer 160 by the lift-off process. The p-electrode 170 may be Ti or Cr-based multilayer structure such as Ni/Au, Ti/Al, Ti/Al/Ni/Au, Cr/Al or Cr/Al/Ni/Au.

Figure 3:
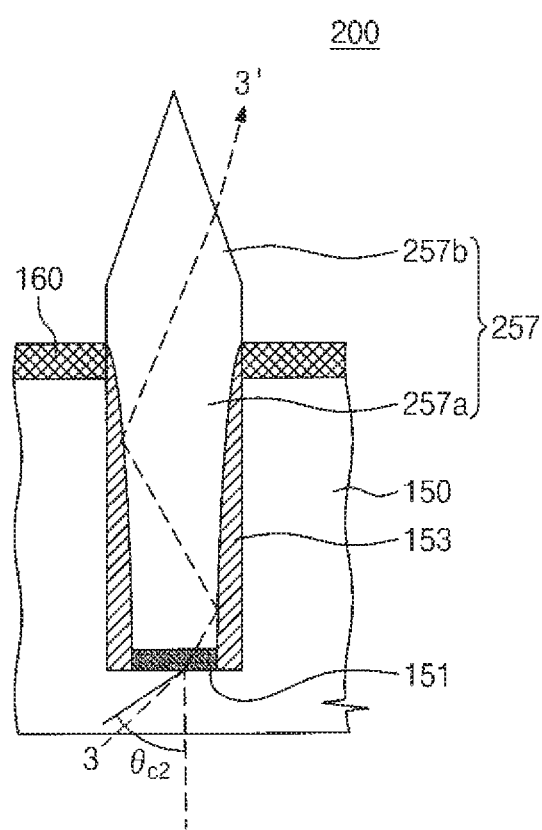
FIG. 3 illustrates a light traveling path formed by a metal oxide structure and a reflective wall according to another example embodiment of the present disclosure.

FIG. 3 illustrates a lateral light emitting diode device 200 according to another example embodiment of the present disclosure.

Referring to FIG. 3, the lateral light emitting diode device 200 according to another example embodiment of the present disclosure includes: a substrate 110; an n-type GaN layer 130 disposed on the substrate 110; an activation layer 140 dispose on the n-type GaN layer 130; a p-type GaN layer 150 disposed on the activation layer 140, a plurality of holes being formed in the p-type GaN layer 150; a current spreading layer 160 disposed on the p-type GaN layer 150; a seed layer 151 disposed on bottom surfaces of the plurality of holes; metal oxide structures 257 grown on the seed layer 151 in a crystal state to fill the plurality of holes; and an n-electrode 190 disposed on the n-type GaN layer 130 exposed by removing portions of the current spreading layer 160, the p-type GaN layer 150, the activation layer 140, and the n-type GaN layer 130.

The metal oxide structures 257 may include a filling portion 257a and a protruding portion 257b. A shape of the protruding portion 257b may be a hexagonal cone. When a light generated from the activation layer 140 impinges on a boundary of the p-type GaN layer 150 and the seed layer 155 at an incident angle less than a critical angle $\theta_{c2}$, the light is refracted to the seed layer 155 to travel to the filling portion 257a. The light impinging to the filling portion 257a is metallically reflected by a reflective wall 153 or totally reflected by a dielectric material to travel to the outside after traveling to the protruding portion 257b (3-3' course). The shape of the protruding portion 257b may control the incident angle to adjust an angle of beam spread of the lateral light emitting diode device 200 and to improve light extraction efficiency.

Figure 4:
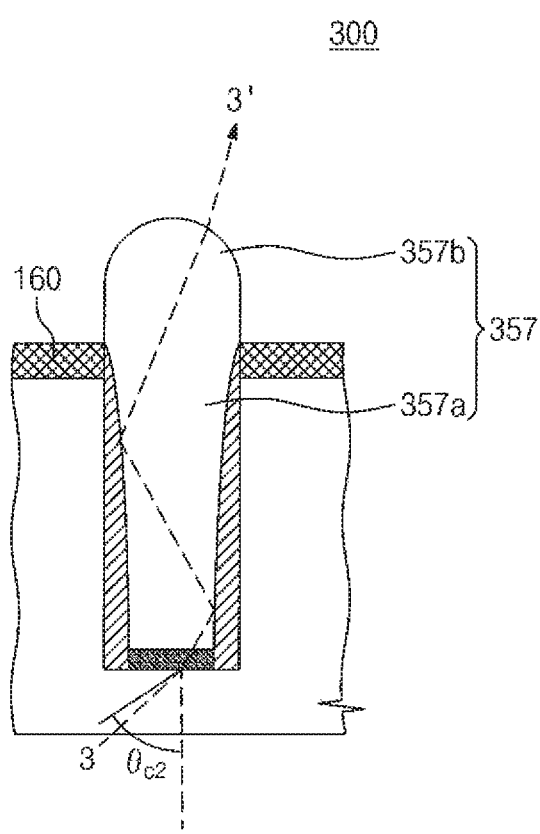
FIG. 4 illustrates a light traveling path formed by a metal oxide structure and a reflective wall according to another example embodiment of the present disclosure.

FIG. 4 illustrates metal oxide structure 357 according to another example embodiment of the present disclosure.

Referring to FIG. 4, a lateral light emitting diode device 300 according to another example embodiment of the present disclosure includes: a substrate 110; an n-type GaN layer 130 disposed on the substrate 110; an activation layer 140 disposed on the n-type GaN layer 130; a p-type GaN layer 150 disposed on the activation layer 140, a plurality of holes being formed in the p-type GaN layer 150; a current spreading layer 160 disposed on the p-type GaN layer 150; a p-electrode 170 disposed on the current spreading layer 160; a seed layer 151 disposed on bottom surfaces of the holes; metal oxide structures 357 grown on the seed layer 151 in a crystal state to fill the plurality of holes; and an n-electrode disposed on the n-type GaN layer 130 exposed by removing portions of the current spreading layer 160, the p-type GaN layer 150, the activation layer 140, and the n-type GaN layer 130.

A shape of the protruding portion 357b is a hemisphere. When a light generated from the activation layer 140 impinges on a boundary of the p-type GaN layer 150 and the seed layer 155 at an incident angle less than a critical angle $\theta_{c2}$, the light is refracted to the seed layer 155 to travel to the filling portion 357a. The light impinging to the filling portion 357a is metallically reflected by a reflective wall 153 or totally reflected by a dielectric material to travel to the outside after traveling to the protruding portion 357b (3-3' course). The shape of the protruding portion 357b may control the incident angle to adjust an angle of beam spread of the lateral light emitting diode device 300 and to improve light extraction efficiency.

Figure 5A:
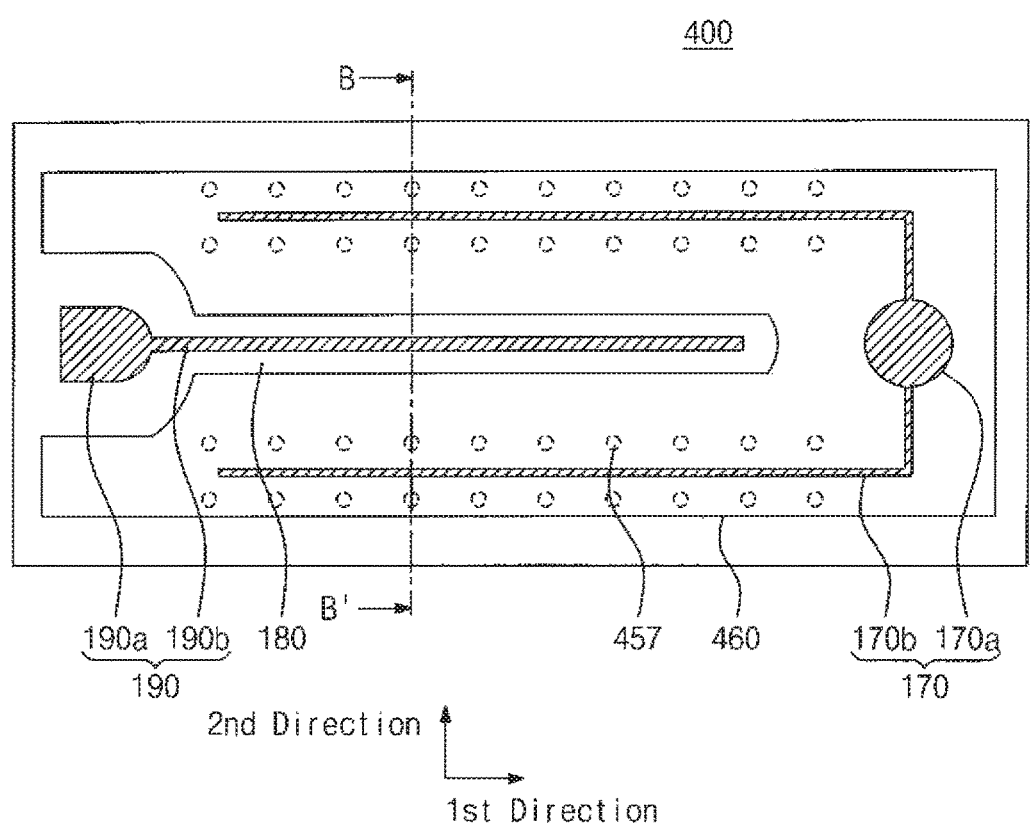
FIG. 5A is a top plan view of a lateral light emitting diode device according to another example embodiment of the present disclosure.

FIG. 5A is a top plan view of a lateral light emitting diode device according to another example embodiment of the present disclosure.

Figure 5B:
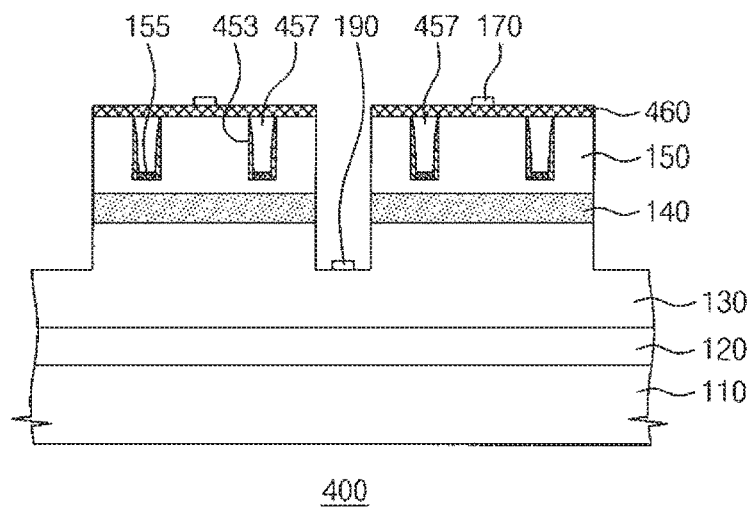
FIG. 5B is a cross-sectional view taken along the line B-B' in FIG. 5A.

FIG. 5B is a cross-sectional view taken along the line B-B' in FIG. 5A.

Figure 5C:
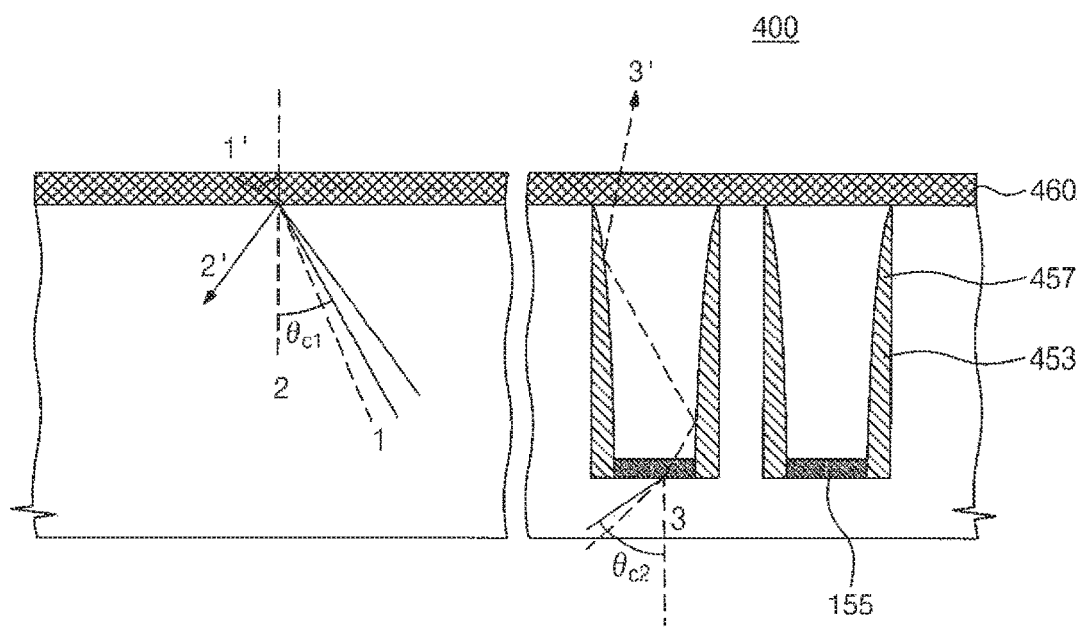
FIG. 5C illustrates a light traveling path formed by a metal oxide structure and a reflective wall in FIG. 5B.

FIG. 5C illustrates a light traveling path formed by a metal oxide structure and a reflective wall in FIG. 5B.

Referring to FIGS. 5A to 5C, a lateral light emitting diode device 400 includes: a substrate 110; an n-type GaN layer 130 disposed on the substrate 110; an activation layer 140 disposed on the n-type GaN layer 130; a p-type GaN layer 150 disposed on the activation layer 140, a plurality of holes being formed in the p-type GaN layer 150; a current spreading layer 460 disposed on the p-type GaN layer 150; a p-electrode 170 disposed on the current spreading layer 460; a seed layer 155 disposed on bottom surfaces of the plurality of holes; metal oxide structures 457 grown on the seed layer 155 in a crystal state to fill the plurality of holes; and an n-electrode 190 disposed on the n-type GaN layer 130 exposed by removing portions of the current spreading layer 460, the p-type GaN layer 150, the activation layer 140, and the n-type GaN layer 130.

A reflective wall 453 may be disposed only on a sidewall of a hole formed only in the p-type GaN layer 150. The current spreading layer 460 is disposed to cover top surfaces of the metal oxide structures 457. The reflective wall 453 may be a metal or a dielectric material. If the reflective wall 453 is the dielectric material, a refractive index of the reflective wall 453 may be smaller than that of the metal oxide structures 457.

The metal oxide structures 457 do not penetrate the current spreading layer 460 and are disposed below the current spreading layer 460. The metal oxide structures 457 are buried in the plurality of holes. A side surface of the metal oxide structure 457 may be in contact with the reflective wall 453, a bottom surface of the metal oxide structure 457 may be in contact with the seed layer 155, and a top surface of the metal oxide structure 457 may be in contact with the current spreading layer 460 and may be disposed on the same plane as a top surface of the p-type GaN layer 150.

A refractive index $N_{NR}$ of a material of the metal oxide structures 457 may satisfy the condition of $N_I < N_{NR} < N_P$ ($N_I$ being a refractive index of the current spreading layer 460 and $N_P$ being a refractive index of the p-type GaN layer 150). For example, when the refractive index $N_P$ of the p-type GaN layer 150 is about 2.4 and the material of the metal oxide structures 457 is zinc oxide (ZnO), the refractive index $N_{NR}$ of the metal oxide structures 457 is about 2.2. When the refractive index $N_P$ of the p-type GaN layer 150 is about 2.4 and the material of the current spreading layer 460 is indium tin oxide (ITO), the refractive index $N_I$ of the current spreading layer 460 is about 1.9. The current spreading layer 460, the metal oxide structure 457, and the p-type GaN layer 150 may have a stepwise reflective index difference. The metal oxide structures 457 may perform gradual wave impedance matching between the p-type GaN layer 150 and the current spreading layer 460. Thus, the metal oxide structures 457 may improve light extraction efficiency of the lateral light emitting diode device 400.

A method for fabricating the lateral light emitting diode device 400 according to an example embodiment of the present disclosure includes: sequentially stacking an n-type GaN layer 130, an activation layer 140, and a p-type GaN layer 150 on a substrate 110; patterning the p-type GaN layer 150 to form a plurality of holes 151; forming a seed layer 155 on bottom surfaces of the plurality of holes 151; growing metal oxide structures 457 on the seed layer 155 in a crystal state; forming a current spreading layer 460 on the substrate 110 where the metal oxide structures 457 are formed; removing portions of the current spreading layer 460, the p-type GaN layer 150, the activation layer 140, and the n-type GaN layer 130 to locally expose the n-type GaN layer 130; and forming an n-electrode 190 on the exposed n-type GaN layer 130 and a p-electrode 170 on the p-type GaN layer 150.

Before the n-type GaN layer 150 is grown on the substrate 110, the buffer layer 170 may be grown on the substrate 110.

Then, the n-type GaN layer 130, the activation layer 140, and the p-type GaN layer 150 are sequentially grown on the substrate 110.

Then, a photoresist (PR) pattern is formed on the p-type GaN layer 150. The P-type GaN layer 150 is patterned using the photoresist pattern as an etching mask. As a result, the plurality of holes 151 are formed in the p-type GaN layer 150. The photoresist pattern is removed.

Then, a preliminary reflective layer that is a metal or a metal alloy is deposited on the substrate 110 by a chemical vapor deposition (CVD) process. The preliminary reflective layer is anisotropically etched. The other portions are removed except for the preliminary reflective layer disposed on sidewalls of the holes 151. The unremoved preliminary reflective layer is the reflective wall 453.

Then, a photoresist (PR) pattern having openings corresponding to positions of the holes 151 is formed on the p-type GaN layer 150. After the seed layer 155 is deposited on bottom surfaces of the holes 151, the photoresist pattern is removed.

Then, the metal oxide structures 457 are grown on the seed layer 155 in a crystal state. The metal oxide structures 457 are grown similarly to a crystalline structure of the seed layer 155.

Then, the current spreading layer 460 is deposited on the p-type GaN layer 150 after the metal oxide structures 457 are grown. The current spreading layer 460 is deposited on the p-type GaN layer 150 by a sputtering process.

Then, portions of the current spreading layer 460, the p-type GaN layer 150, the activation layer 140, and the n-type GaN layer 130 are locally removed. As a result, the lateral light emitting diode device 400 may have a mesa structure.

Then, the n-electrode 190 is formed on the exposed n-type GaN layer 130. The, the p-electrode 170 is formed on the p-type GaN layer 150.

According to an example embodiment of the present disclosure, metal oxide structures may serve as an optical waveguide to emit a light generated from an activation layer to the outside through the metal oxide structures. As a result, light extraction efficiency of a light emitting diode device may be improved.

According to an example embodiment of the present disclosure, when metal oxide structures are buried in a nitride semiconductor, a reflective wall that is a metal or a metal alloy covering the surrounding of the metal oxide structures is provided. Thus, a light impinging into the metal oxide structure may be metallically reflected by the reflective wall to be easily extracted to the outside. As a result, light extraction efficiency of a light emitting diode device may be improved.

According to an example embodiment of the present disclosure, since the reflective wall is a metal or a metal alloy having a high electric conductivity, holes flowing in from a p-electrode may uniformly migrate to a p-type GaN layer through the reflective wall. Thus, electrons and holes may be combined in a wide area of the activation layer. As a result, light extraction efficiency of a light emitting diode device may be improved.

According to an example embodiment of the present disclosure, an angle of beam spread may be adjusted by adjusting shape, form, and length of an exposed portion of a metal oxide structure. If growth conditions of the metal oxide structure are adjusted, one end of the metal oxide structure may have a shape of a hexagonal cone, a, a cone, a truncated cone, a hexagonal pillar or a cylinder. As a result, the angle of beam spread may be adjusted.

Although the present disclosure and its advantages have been described in detail, it should be understood that various changes, substitutions and alterations can be made herein without departing from the spirit and scope of the disclosure as defined by the following claims.

What is claimed is:

1. A lateral light emitting diode device comprising:
   a substrate;
   an n-type GaN layer on the substrate;
   an activation layer on the n-type GaN layer;
   a p-type GaN layer on the activation layer, wherein a plurality of holes are in the p-type GaN layer;
   a current spreading layer on the p-type GaN layer;
   a p-electrode on the current spreading layer;
   a seed layer on bottom surfaces of the plurality of holes;
   a reflective wall on inner sidewalls of the plurality of holes;
   crystalline metal oxide structures on the seed layer filling the plurality of holes; and
   an n-electrode on an area of the n-type GaN layer exposed through removed portions of the current spreading layer, the p-type GaN layer, the activation layer, and the n-type GaN layer.

2. The lateral light emitting diode device as set forth in claim 1, wherein:
   the plurality of holes penetrate the current spreading layer, and
   the metal oxide structures protrude above the current spreading layer.

3. The lateral light emitting diode device as set forth in claim 1, wherein:
the current spreading layer covers top surfaces of the metal oxide structures, and
the top surfaces of the metal oxide structures are coplanar with a top surface of the p-type GaN layer.

4. The lateral light emitting diode device as set forth in claim 1, wherein:
the reflective wall is a dielectric material, and
a reflective index of the metal oxide structures is greater than a refractive index of the reflective wall and smaller than a refractive index of the p-type GaN layer.

5. The lateral light emitting diode device as set forth in claim 1, wherein:
the metal oxide structures include a metal oxide selected from the group consisting of zinc oxide (ZnO), zirconium oxide ($ZrO_2$), titanium oxide ($TiO_2$), chrome oxide ($Cr_2O$), indium zinc oxide (IZO), indium zinc tin oxide (IZTO), indium oxide ($In_2O_3$), and tin oxide ($SnO_2$).

6. The lateral light emitting diode device as set forth in claim 1, wherein:
a depth D and a width W of each of the plurality of holes satisfy a condition in which D>W/4.

7. The lateral light emitting diode device as set forth in claim 1, wherein:
a diameter W of each of the plurality of holes satisfies a condition in which W/$\lambda$>2.405 ($\lambda$, being a wavelength of a light emitted from the activation layer).

8. The lateral light emitting diode device as set forth in claim 1, wherein:
a depth of each of the plurality of holes is between 200 nanometers and 1 micrometer.

9. The lateral light emitting diode device as set forth in claim 1, wherein:
a depth of each of the plurality of holes is between 300 nanometers and 4 micrometers.

10. The lateral light emitting diode device as set forth in claim 1, wherein:
a shape of the metal oxide structure is a hexagonal cone, a hexagonal pillar, a hemisphere, a cone, a truncated cone or a cylinder.

11. The lateral light emitting diode device as set forth in claim 1, wherein the reflective wall comprises a dielectric material.

12. The lateral light emitting diode device as set forth in claim 1, wherein the reflective wall has a refractive index that is smaller than a reflective index of the metal oxide structures.

13. The lateral light emitting diode device as set forth in claim 1, wherein the reflective wall has a refractive index that is smaller than a refractive index of the p-type GaN layer.

14. The lateral light emitting diode device as set forth in claim 6, wherein the depth D is from 200 nanometers to 1 micrometer.

15. The lateral light emitting diode device as set forth in claim 6, wherein the depth D is from 300 nanometers to 4 micrometers.

* * * * *